United States Patent
Taki et al.

[11] Patent Number: 5,359,177
[45] Date of Patent: Oct. 25, 1994

[54] MICROWAVE PLASMA APPARATUS FOR GENERATING A UNIFORM PLASMA

[75] Inventors: Masakazu Taki; Kenji Yoshizawa; Junichi Nishimae; Keisuke Namba, all of Hyogo, Japan

[73] Assignee: Mitsubishi Denki Kabushiki Kaisha, Tokyo, Japan

[21] Appl. No.: 778,569

[22] Filed: Oct. 17, 1991

[30] Foreign Application Priority Data

Nov. 14, 1990 [JP] Japan .................................. 2-310364
Nov. 14, 1990 [JP] Japan .................................. 2-310365

[51] Int. Cl.⁵ .......................... B23K 9/00; H05H 1/46
[52] U.S. Cl. .......................... 219/121.43; 219/121.52; 156/345; 204/298.38
[58] Field of Search .................. 219/121.43, 10.55 F, 219/121.4, 121.52, 10.55 A; 156/345, 643, 646; 204/298.17, 298.18, 298.37, 298.38

[56] References Cited

U.S. PATENT DOCUMENTS

| | | | |
|---|---|---|---|
| 4,543,465 | 9/1985 | Sakudo et al. | 219/121.43 |
| 4,987,284 | 1/1991 | Tujimura et al. | 219/121.43 |
| 5,061,838 | 10/1991 | Lane et al. | 219/121.59 |

FOREIGN PATENT DOCUMENTS

| | | |
|---|---|---|
| 0183561 | 11/1985 | European Pat. Off. |
| 4100462 | 7/1991 | Fed. Rep. of Germany |
| 131454 | 6/1986 | Japan |
| 0100896 | 4/1989 | Japan |
| 0120812 | 5/1989 | Japan |
| 0461741 | 2/1992 | Japan |

Primary Examiner—Mark H. Paschall
Attorney, Agent, or Firm—Wolf, Greenfield, & Sacks

[57] ABSTRACT

A microwave plasma apparatus comprises a discharge chamber for generating a plasma. A dielectric plate is placed on a surface of the discharge chamber. A microwave circuit surrounds the longitudinal side surface of the dielectric plate and the microwave circuit is adapted to couple the signal propagating therein to the dielectric plate, whereby a microwave electric field is formed within the discharge chamber to generate a plasma therein. The microwave circuit may comprise a rectangular waveguide, and a part of a wall surface of the rectangular waveguide is utilized as a terminal portion.

43 Claims, 12 Drawing Sheets

Fig. 1

PRIOR ART

POSITION IN DISCHARGE SPACE IN MICROWAVE TRAVELLING DIRECTION (cm)

MICROWAVE PLASMA APPARATUS FOR GENERATING A UNIFORM PLASMA

BACKGROUND OF THE INVENTION

1. Field of the Invention

This invention relates to a microwave plasma apparatus, and more particularly, to a microwave plasma apparatus which is adapted to generate a vacuum ultraviolet light for use in plasma processes such as etching and chemical vapor deposition (CVD), and photoexcited processes such as photo-assisted CVD.

2. Prior Art

Figure 1:
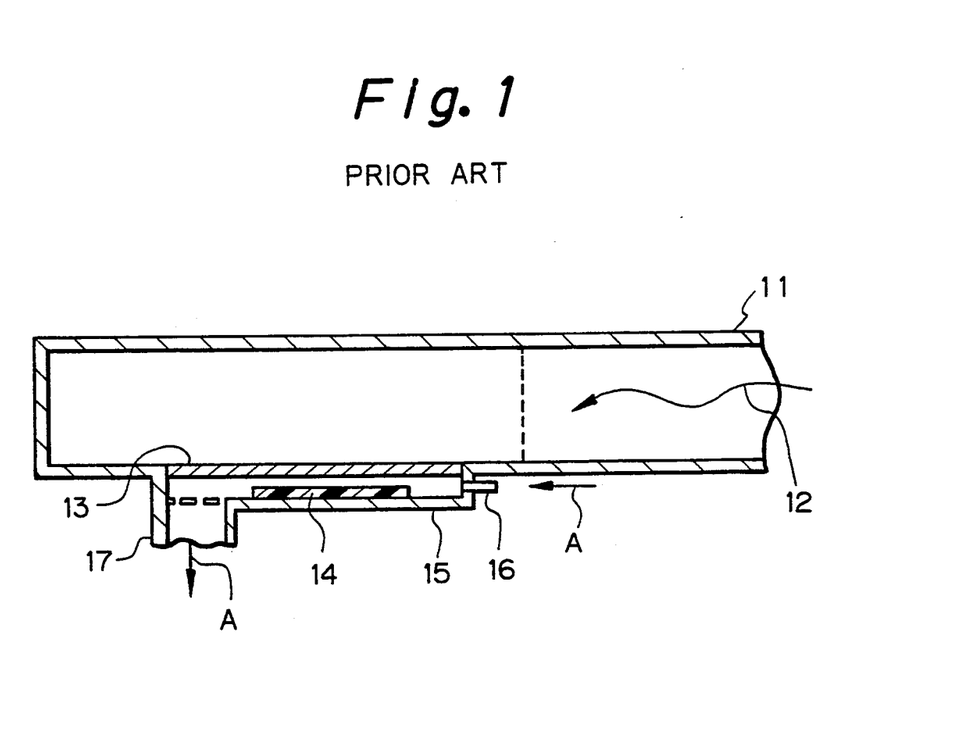
FIG. 1 is a cross-sectional view showing the construction of a conventional microwave plasma apparatus.

FIG. 1 is a cross-sectional view of a microwave plasma apparatus using conventional microwave discharge disclosed in Japanese Patent Public Disclosure No. 131454/86. In the drawing, a microwave transmitting window 13 made of quartz or a ceramic is provided perpendicularly to an electric field generated by a microwave signal which propagates in a waveguide 11 in the direction indicated by an arrow 12. In a discharge space including the window 13 as a surface, there is placed an object to be processed, for example, a wafer 14. Reference numeral 15 designates a stage; 16 a gas lead-in port; and 17 an exhaust port coupled to a known exhaust facility (not shown). An arrow A in the drawing indicates the direction of flow of a gas.

Operation of the above-mentioned apparatus will now be described. A microwave signal transmitted in the waveguide 11 as indicated by the arrow 12 is absorbed by the microwave transmitting window 13 disposed perpendicularly to the direction of electric field of the microwave signal and discharges a gas in the vacuum chamber to generate a plasma. Oxygen gas, for example, if used as a discharge gas, can peel off a resist on the wafer 14.

Since this microwave plasma apparatus is constructed as described above, a plasma tends to be uniformly distributed in the discharge space if a plasma generating area is extended as required by a recent increase in diameters of wafers. More specifically, since the microwave signal is coupled to the plasma so strongly, the microwave signal is rapidly absorbed by the plasma in a direction of travel of the microwave signal, whereby the plasma is inhibited from diffusing. Also, as the plasma distribution in a direction perpendicular to the direction of travel of the microwave signal corresponds to an electric field distribution in the longitudinal direction of the waveguide 11, the plasma tends to be weak in the vicinity of both sides of the discharge space and strong in a central portion of the discharge space, thus being uniformly distributed.

Such a microwave plasma apparatus as mentioned above may be applied to a microwave discharge light source unit in which an ultraviolet light is generated by a generated plasma and employed for photoexcited processes such as photoassisted CVD.

Figure 2:
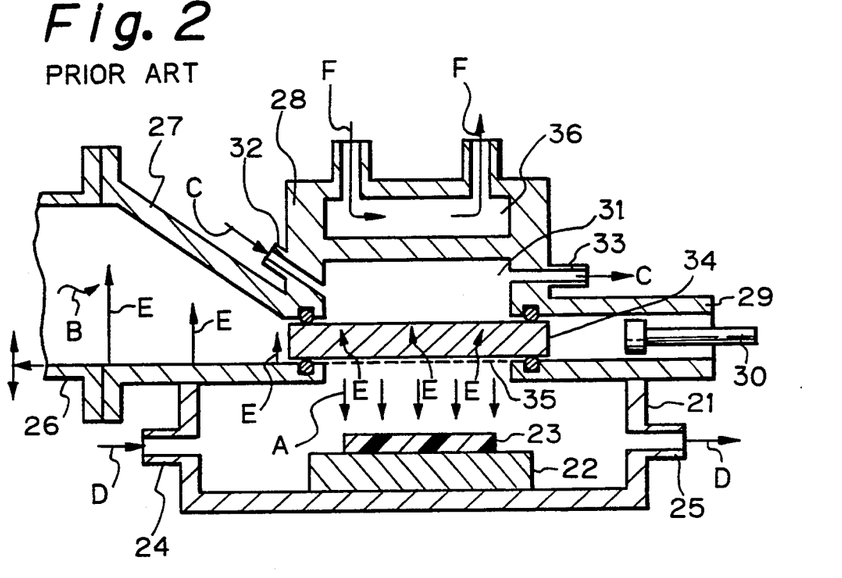
FIG. 2 is a cross-sectional view showing the construction of a conventional microwave discharge plasma apparatus.

FIG. 2 is a cross-sectional view showing a photoexcited process apparatus using a conventional microwave discharge light source unit shown in Japanese Patent Public Disclosure No. 4762/90. In the drawing, a substrate holder 22 is disposed in a reaction chamber 21, and a substrate 23 is placed thereon. A reaction gas is supplied from a lead-in port 24 into the reaction chamber 21 and exhausted from an exhaust port 25.

One end of a square waveguide 26 is coupled to one side of a circular discharge chamber 28 through a tapered waveguide 27 having one of the E-planes tapered. The other side of the discharge chamber 28 is coupled to a thin waveguide 29 in which a terminal 30 is movably provided. A discharge gas is supplied to the discharge space 31 of the discharge chamber 28 from a lead-in port 32 and exhausted from an exhaust port 33. On the lower surface of the discharge space 31 is provided a dielectric plate 34 made of sapphire or the like to form a light transmissive window for transmitting therethrough an ultraviolet light generated in the discharge space 31. The length of the longitudinal end of the dielectric plate 34, that is, the thickness thereof is substantially the same as the inner diameter of the tapered waveguide 27 and the waveguide 29. Along the lower surface of the dielectric plate 34, a light transmissive microwave reflecting member 35 is provided. Specifically, this reflecting member 35 is located opposite to the discharge space 31 with respect to the dielectric plate 34 and made, for example, of a metal mesh plate which reflects microwaves and transmits light. On the upper side of the discharge space 31 of the discharge chamber 28, there is provided a cooling path 36 in which a coolant liquid is circulated. O-rings are interposed respectively between an end portion of the tapered waveguide 27 and the dielectric plate 34 and between an end portion of the thin waveguide 29 and the dielectric plate 34 to thereby provide a vacuum seal for the discharge space 31. Similarly, a light source apparatus comprised of the discharge chamber 28 is separated from the reaction chamber 21 by another O-ring. In FIG. 2, an arrow A indicates the direction of the generated ultraviolet light; an arrow B the direction of propagation of the microwave; an arrow C the direction of flow of the discharge gas; an arrow D the direction of flow of the reaction gas; an arrow E the direction of the electric field; and an arrow F the direction of flow of the coolant liquid.

Next, operation of the apparatus shown in FIG. 2 will be described. The microwave signal propagated in the square waveguide 26 and its electric field (the arrow E) is gradually intensified by the tapered waveguide 27, and is coupled to the dielectric plate 34. Since the electric field within the waveguide is propagated parallel to the width of the dielectric plate 34, the microwave signal is coupled to the dielectric plate 34 with high efficiency. The microwave signal, while transmitting through the dielectric plate 34, is gradually coupled to the discharge space 31, whereby a gas existing in the discharge space 31 is discharged to cause a light emission. An ultraviolet light thus generated irradiates the substrate 23 placed in the reaction chamber 21 to perform a photoexcited process such as a photo-assisted CVD and an optical etching.

Figure 3:
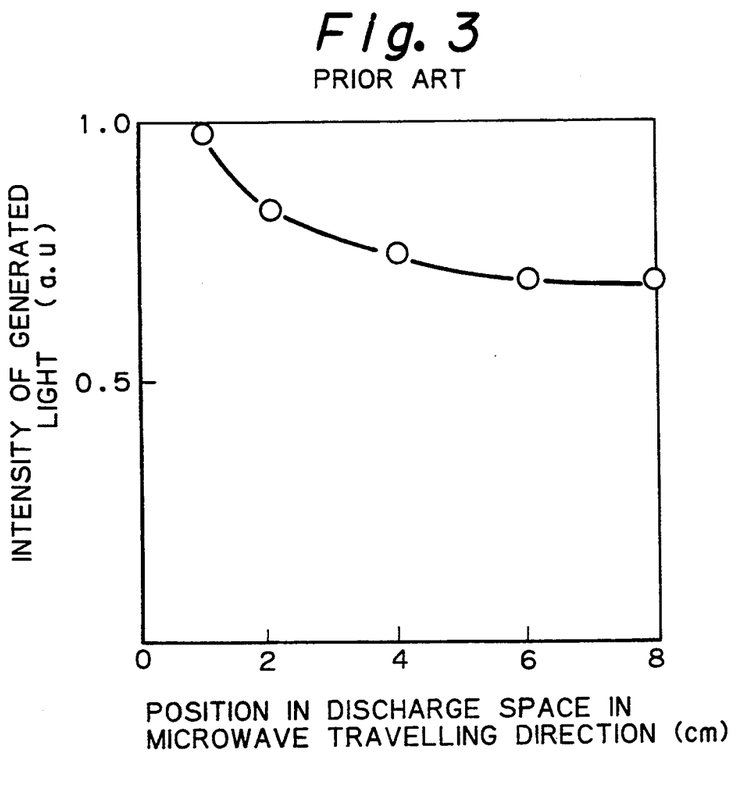
FIG. 3 is a graph showing a distribution of a light generated by the apparatus of FIG. 2.

Since the microwave discharge light source apparatus shown in FIG. 2 is constructed such as described above, if a light generating area of the light source is enlarged for irradiating a larger area, the distribution of light generated from the surface of such an enlarged area tends to lack uniformity. FIG. 3 shows results of measuring the distribution of generated light in the direction of travel of the microwave in the microwave signal discharge light source apparatus shown in FIG. 2. In the graph, the abscissa represents the position (cm) in the discharge space in the direction of travel of the microwave signal measured from the microwave supply side, and the ordinate intensity (a.u) of the generated light. As shown in the graph, the intensity of the generated light tends to be strongest at the microwave supply side and becomes gradually weaker at positions further away from the supply side. This is because the microwave signal is attenuated during travel due to strong coupling of microwave with plasma. This tendency becomes more pronounced in relation to larger light generating surfaces, thereby resulting in the problem that luminance distribution becomes nonuniform on a light generating surface.

SUMMARY OF THE INVENTION

This invention has been made to solve the above-mentioned problems, and one object of the invention is to provide a microwave plasma apparatus having a large dimension and which is capable of generating a uniform plasma.

Another object of this invention is to provide a microwave discharge light source apparatus which is capable of uniformly irradiating a large area.

To achieve the above objects, a microwave plasma apparatus according to the present invention comprises:
 a discharge chamber for generating a plasma;
 a dielectric plate placed on a surface of the discharge chamber; and
 a microwave circuit surrounding the longitudinal side surface of the dielectric plate, the microwave circuit adapted to couple the microwave signal propagating in the microwave circuit to the dielectric plate;
 wherein a microwave electric field is formed within the discharge chamber to generate a plasma.

In a first embodiment of the invention, there is provided a microwave plasma apparatus which comprises:
 a discharge chamber for generating a plasma;
 a dielectric plate placed on a surface of the discharge chamber; and
 a microwave circuit surrounding the longitudinal side surface of the dielectric plate, the microwave signal circuit adapted to cause the microwave having an electric field component in the width of the dielectric plate to propagate in the microwave signal circuit and introduce the microwave from the side surface of the dielectric plate so as to couple the microwave signal to the dielectric plate,
 wherein a microwave electric field is formed within the discharge chamber to generate a plasma.

In a second embodiment of the invention, there is provided a microwave discharge light source apparatus which comprises:
 a discharge chamber for generating a plasma;
 a dielectric plate placed on a surface of the discharge chamber;
 a microwave reflecting member disposed along the dielectric plate; and
 a microwave circuit surrounding the longitudinal side surface of the dielectric plate, the microwave circuit adapted to introduce a microwave having an electric field component in the width of the dielectric plate from the dielectric plate and couple the microwave to the dielectric plate,
 wherein a microwave electric field is formed within the discharge chamber to generate a plasma, and light from the plasma passes through the microwave reflecting member.

In the first and second embodiments of the invention, the microwave circuit may comprise a rectangular waveguide, and a part of a wall surface of the rectangular waveguide may be used as the terminal thereof.

In this invention, a microwave in the microwave circuit surrounding the side surface of the dielectric plate has an electric field component in the width of the dielectric plate. As a result, the microwave is coupled to the dielectric plate on the entire side surface thereof, whereby a microwave electric field can be uniformly formed in the dielectric plate, and the microwave signal can be uniformly coupled to the discharge chamber.

DESCRIPTION OF THE PREFERRED EMBODIMENTS

Figure 4:
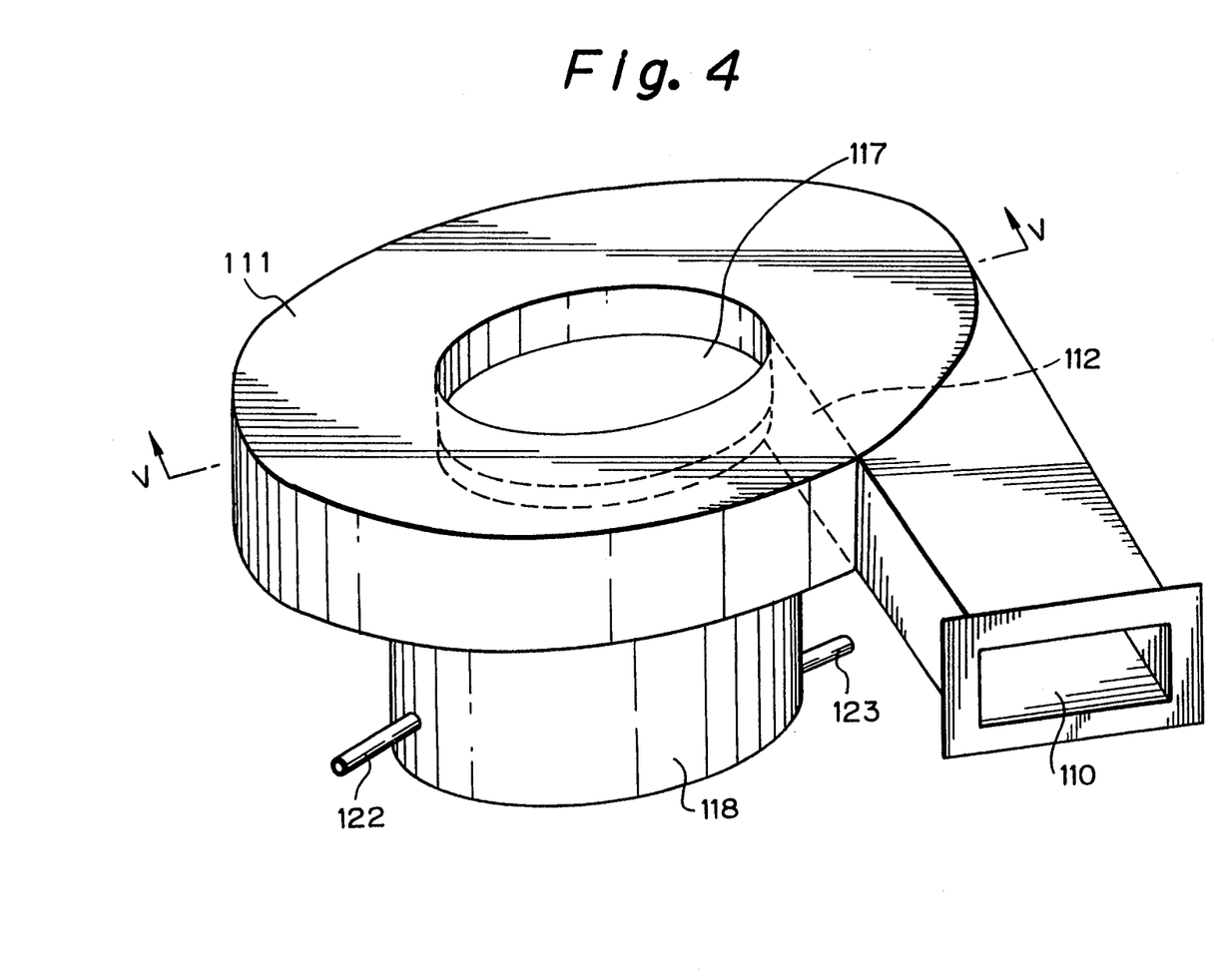
FIG. 4 is a perspective view showing a first embodiment of a microwave plasma apparatus according to the invention.
Figure 5:
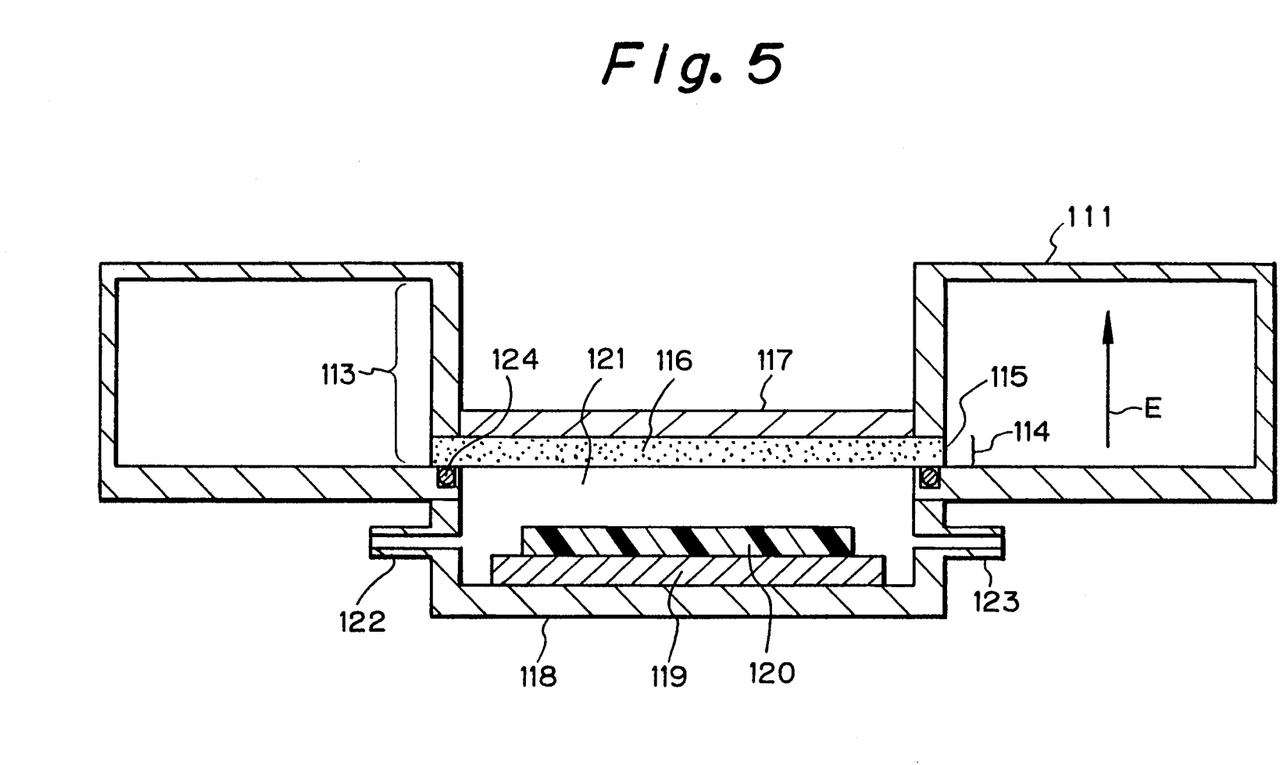
FIG. 5 is a cross-sectional view taken along a line V—V shown in FIG. 4.

FIG. 4 is a perspective view showing a plasma processing apparatus using an embodiment of a microwave plasma apparatus of the invention, and FIG. 5 is a cross-sectional view taken along a V—V line in FIG. 4. In these drawings, a microwave signal is supplied from a supply port 110 to a microwave circuit, for example, a ring-shaped rectangular waveguide 111. The ring-shaped rectangular waveguide 111 is provided with a terminal plate 112. The terminal plate 112 constitutes an end portion of the microwave circuit as well as a part of an E-plane 113 of the rectangular waveguide 111. On the lower end of the E-plane 113 of the ring-shaped rectangular waveguide 111, a slit 114 is formed in the direction of travel of the microwave signal propagating in the rectangular waveguide 111. A side surface 115 of a circular dielectric plate 116 made of quartz glass is fitted into this slit 114. The thickness of the dielectric plate 116 is substantially identical to the width of the slit 114. A conductive plate 117 is disposed in contact with the upper surface of the dielectric plate 116. An end portion of the conductive plate 117 is electrically and mechanically connected to the rectangular waveguide 111. In this manner, the rectangular waveguide 111 surrounds the dielectric plate 116.

A vacuum chamber 118 is disposed below the dielectric plate 116, and a substrate base 119 for placing a substrate 120 is disposed in a discharge space 121 formed inside the vacuum chamber 118. A gas is supplied from a lead-in port 122 to the discharge space 121 for generating a plasma and exhausted from an exhaust port 123. The vacuum chamber 118 is separated from the rectangular waveguide 111 by an O-ring 124. An arrow E in FIG. 5 indicates the direction of an electric field.

Next, operation of the microwave signal plasma apparatus shown in FIGS. 4 and 5 will be described. A microwave supplied from the microwave supply port 110, while propagating in the ring-shaped rectangular waveguide 111, is coupled to the dielectric plate 116 on the entire circumference of the side surface 115 thereof. Since the microwave electric field in the rectangular waveguide 111 is formed in the direction indicated by the arrow E, that is, the electric field in the rectangular waveguide 111 is parallel to the width of the dielectric plate 116, the microwave signal is easily coupled to the dielectric plate 116. Namely, the microwave signal, travelling in the waveguide 111, is gradually coupled to the dielectric plate 116. The microwave signal coupled to the dielectric plate 116 discharges a gas in the discharge space 121. In this embodiment, while the microwave is gradually coupled to the side face 115 of the dielectric plate 116 through the slit 114 while travelling around the rectangular waveguide 111, the microwave is transmitted from the whole circumference of the side face 115 of the dielectric plate 116 toward the center of the same, whereby the gas is uniformly discharged throughout the discharge space 121. Thus, an etching gas, a CVD gas and the like, when supplied from the lead-in port 122, can etch a wafer 120 and carry out CVD processing, respectively. By way of example, when the frequency of a supplied microwave signal was selected to be 2.45 GHz, the distance between the centers of the diametrically separated portions of the ring-shaped waveguide 111 approximately 35 cm, and the diameter of the dielectric plate 116 25 cm, and $O_2$ gas of 0.1 (TORR) was discharged in the discharge space 121, a plasma was generated substantially throughout the discharge space 121 having a diameter of 20 cm. Such a uniform plasma generated from a large area allows wafers of larger diameters to be processed.

Figure 6:
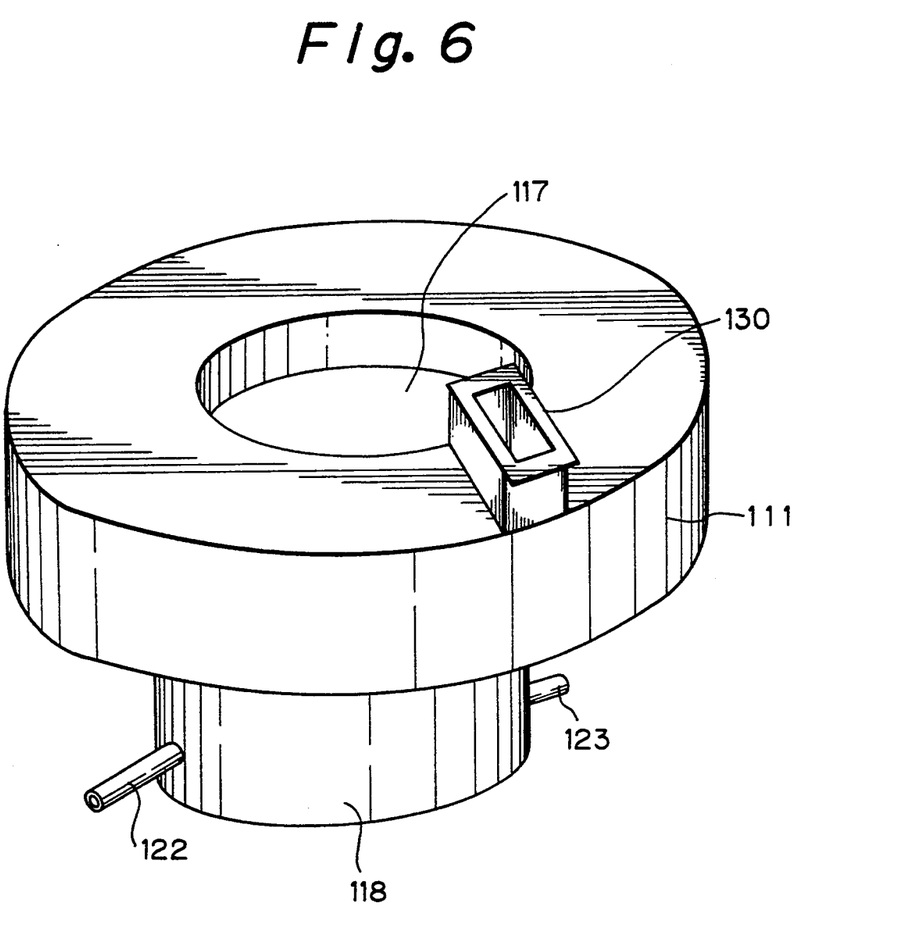
FIGS. 6–8 are diagrams showing modified examples of the microwave plasma apparatus of the first embodiment of the invention.

Although in the above described embodiment, the direction of introducing the microwave signal is made coincident with the direction of travel of the microwave signal in the ring-shaped rectangular waveguide, a microwave supply port 130 may be provided on an H-plane of the rectangular waveguide 111, as shown in FIG. 6. This modified construction is advantageous in that the apparatus can be reduced in width. In this construction, the terminal plate which serves as the end of the rectangular waveguide 111 may be formed by the H-plane of the rectangular waveguide 111.

Figure 7:
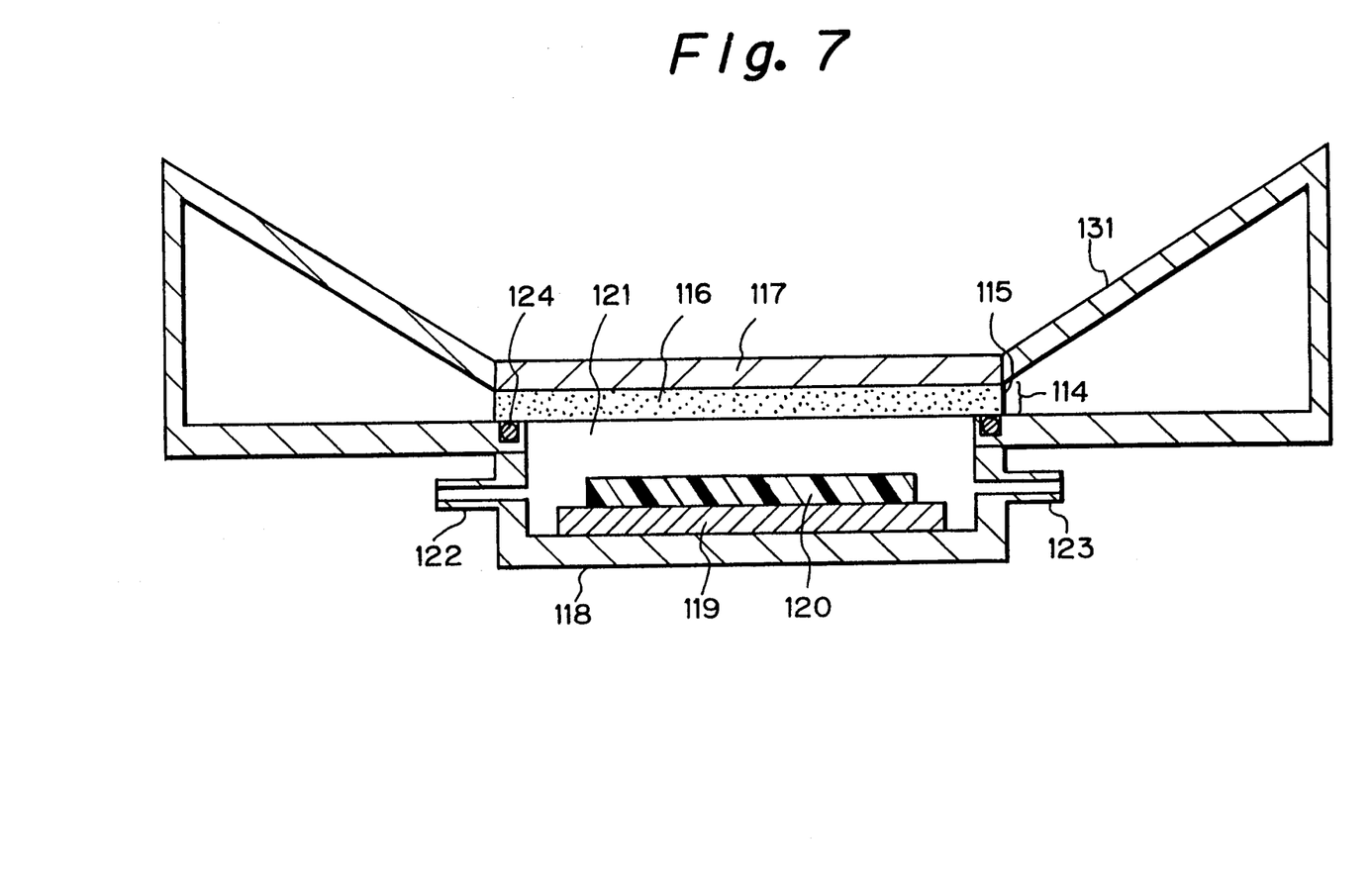

Also, in place of the rectangular waveguide, a wedge-shaped waveguide 131 as shown in FIG. 7 may be used as the microwave transmitting circuit for intensifying the microwave electric field which is coupled to the dielectric plate.

Figure 8:
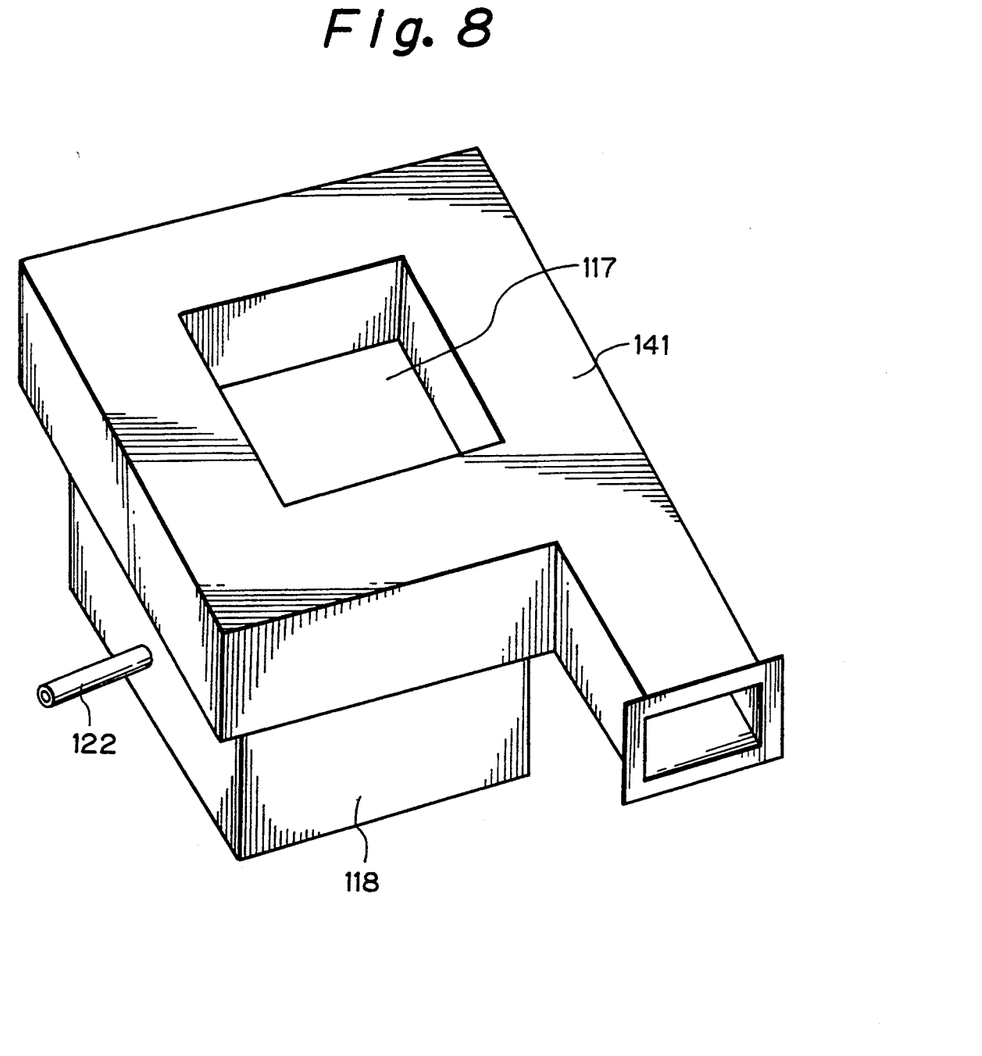

Further, in place of the ring-shaped waveguide shown in the embodiment, a square-shaped waveguide 141 as shown in FIG. 8 may be employed. In this case, the dielectric plate is also shaped in a square form.

The above described embodiment employs quartz glass for the dielectric plate. However, alumina ceramics may be alternatively employed.

As described above, a plasma apparatus according to the first embodiment of the invention employs a dielectric plate to form a plane of a discharge space for generating a plasma. The longitudinal side surface of the dielectric plate is surrounded by a microwave circuit, and a microwave signal having an electric field component in the width of the dielectric plate is introduced from the side surface of the dielectric plate and coupled to the dielectric plate. Thus, the plasma apparatus is constructed so as to establish a microwave electric field in the discharge space to generate a plasma, thereby making it possible to generate a uniform plasma of a large area. The microwave circuit is composed of a rectangular waveguide, a portion of the wall surface of which is used as a terminal of the microwave circuit, thereby enabling the number of elements constituting the plasma apparatus to be reduced.

Figure 9:
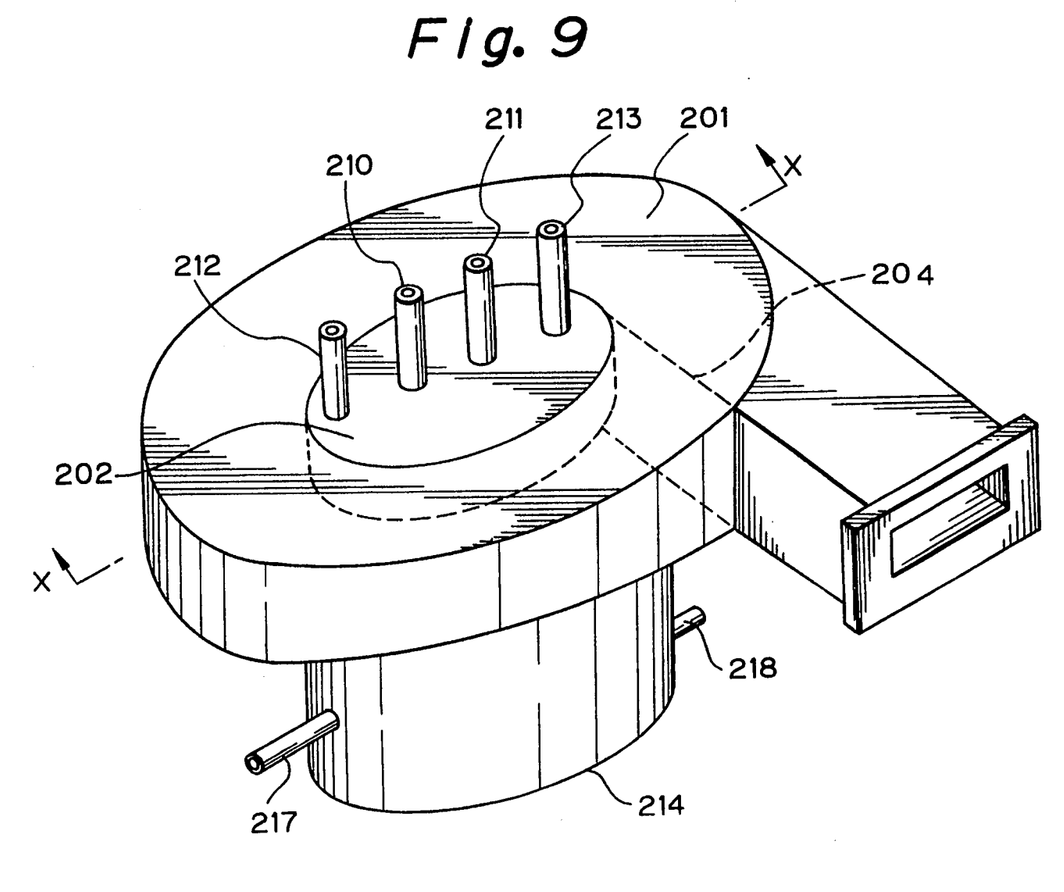
FIG. 9 is a perspective view showing a second embodiment of a microwave plasma apparatus according to the invention which is embodied as a microwave discharge light source apparatus.
Figure 10:
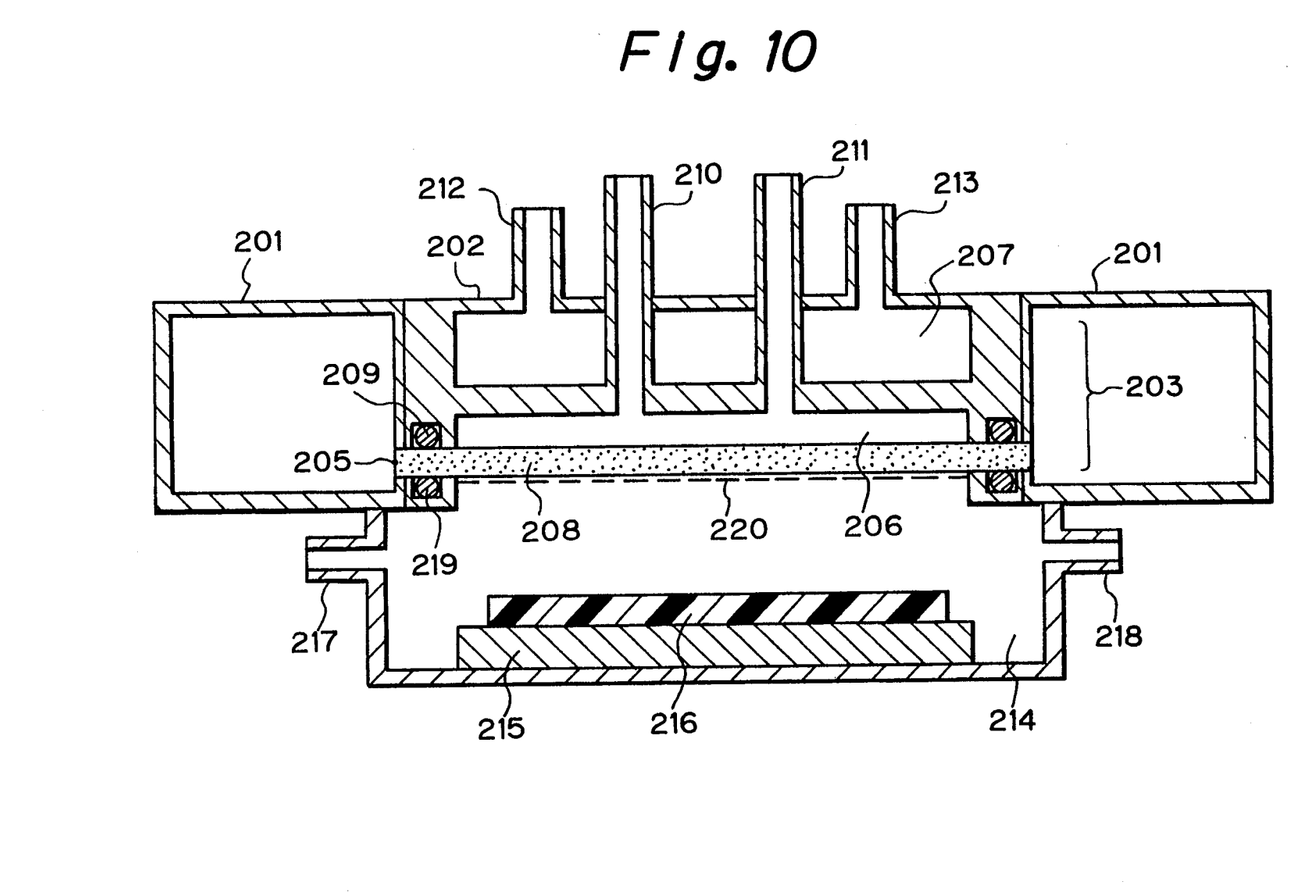
FIG. 10 is a cross-sectional view taken along a line X—X shown in FIG. 9.

FIG. 9 is a perspective view of a second embodiment of a microwave plasma apparatus according to the invention, and FIG. 10 a cross-sectional view taken along a line X—X in FIG. 9. The second embodiment comprises a microwave discharge light source apparatus, and the drawings show a photoexcited process apparatus using the same. In FIGS. 9 and 10, the microwave discharge light source apparatus has a ring-shaped rectangular waveguide 201 and a discharge chamber 202. A part of an E-plane 203 of the rectangular waveguide 201 serves as a terminal plate 204 for the rectangular waveguide 201. Below the E-plane inside the rectangular waveguide, a slit 205 is formed along the direction of travel of a microwave signal which propagates in the rectangular waveguide 201. The discharge chamber 202 is provided with a circular discharge space 206 and a cooling bath 207. A light transmissive circular dielectric plate 208 made of quartz glass is disposed on the lower surface of the discharge space 206. The thickness of the dielectric plate 208 is substantially identical to the width of the slit 205 into which the end of the dielectric plate 208 is fitted. The rectangular waveguide 201 thus surrounds the discharge chamber 202. The discharge space 206 is separated from the rectangular waveguide 201 by an O-ring 209, whereby a gas for generating a plasma supplied from a lead-in port 210 and exhausted from an exhaust port 211 is enclosed in the discharge space 206. A cooling bath 207 for cooling the discharge space 206 is supplied with a coolant liquid from a supply port 212, which liquid is exhausted from an exhaust port 213.

A reaction chamber 214 is provided below the microwave discharge light source apparatus, and a substrate 216 is placed on a base 215 disposed inside the reaction chamber 214. A reaction gas is supplied from a lead-in port 217 to the reaction chamber 214 and exhausted from an exhaust port 218. The reaction chamber 214 is separated from the rectangular waveguide 201 by an O-ring 219. On the upper surface of the reaction chamber 216 or along the Lower surface of the dielectric plate 208, a light transmissive reflecting member, for example, a metal mesh plate 220 is provided for reflecting the microwave signal and transmitting light.

Next, operation of the microwave discharge light source apparatus will be described. A microwave signal supplied from the microwave supply port, while propagating in the rectangular waveguide 211, is coupled to the dielectric plate 208 from the entire circumference of the longitudinal side surface thereof. Since an electric field in the rectangular waveguide 201 is parallel to the width of the dielectric plate 208, the microwave signal is gradually coupled to the dielectric plate 208 as it travels in the rectangular waveguide 201. The microwave signal coupled to the dielectric plate 208 discharges a gas existing in the discharge space 206 to cause the discharged gas to emit light. An ultraviolet light thus generated is radiated to the reaction chamber 214 to irradiate the substrate 216. Since the microwave signal is gradually coupled to the side surface of the dielectric plate 208 from the slit 205 while travelling around the rectangular waveguide 201, the microwave signal is transmitted from the entire circumference of the side surface of the dielectric plate 208 toward the center of the same, whereby the gas is uniformly discharged to uniformly emit a light over the whole discharge space 206. Also, an electric field intensity is high, the discharge space 206 is defined by the wall of the discharge chamber 202, and the heat generated by the discharge is removed by the cooling bath 207, thereby making it possible to readily increase a discharge power density, thus enabling the luminance of the emitted light to be enhanced.

Figure 11:
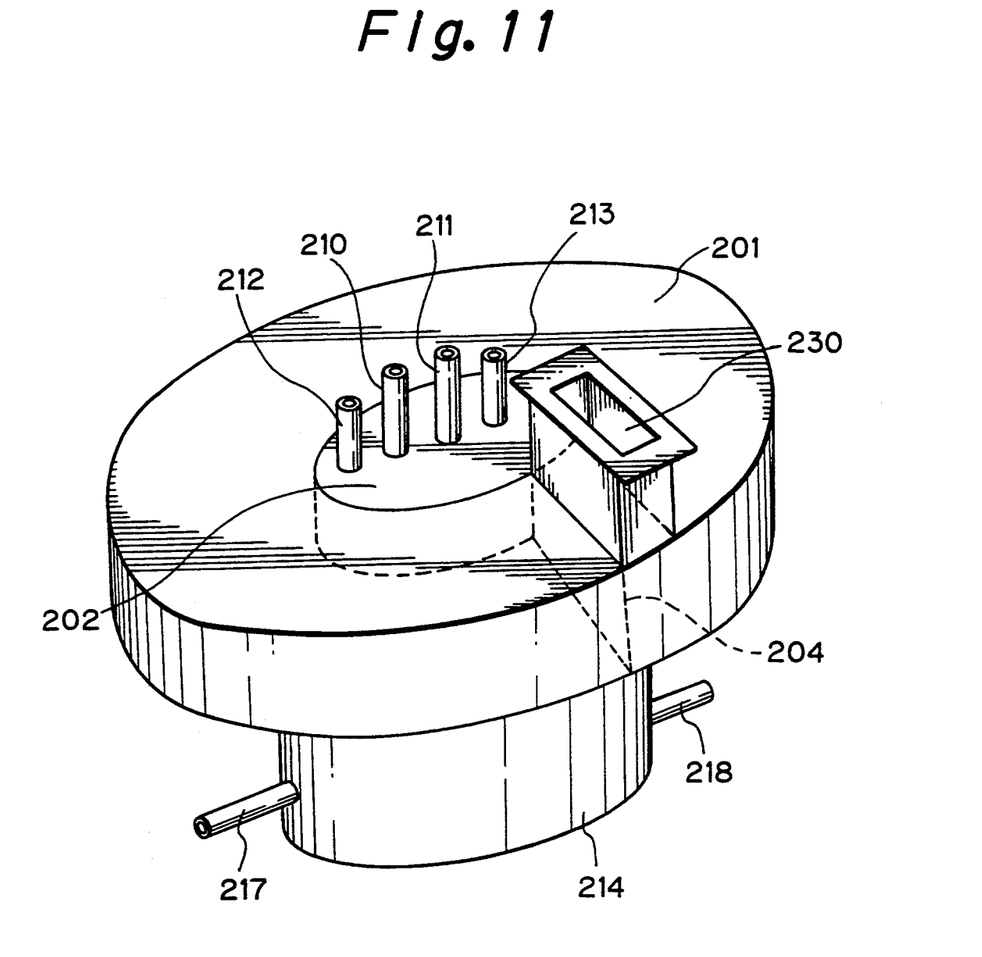
FIGS. 11–13 are diagrams showing modified examples of the microwave discharge light source apparatus of the second embodiment of the invention.

Although in the above described embodiment, the microwave is introduced in a direction coincident with the direction in which the microwave signal travels in the rectangular waveguide 201, a supply port 230 as shown in FIG. 11 may be formed on an H-plane of the rectangular waveguide 201. Such a construction is advantageous in that the apparatus can be reduced in width. In this case, the terminal plate 204 provided on the rectangular waveguide 201 may be formed of the H-plane of the rectangular waveguide 201.

Figure 12:
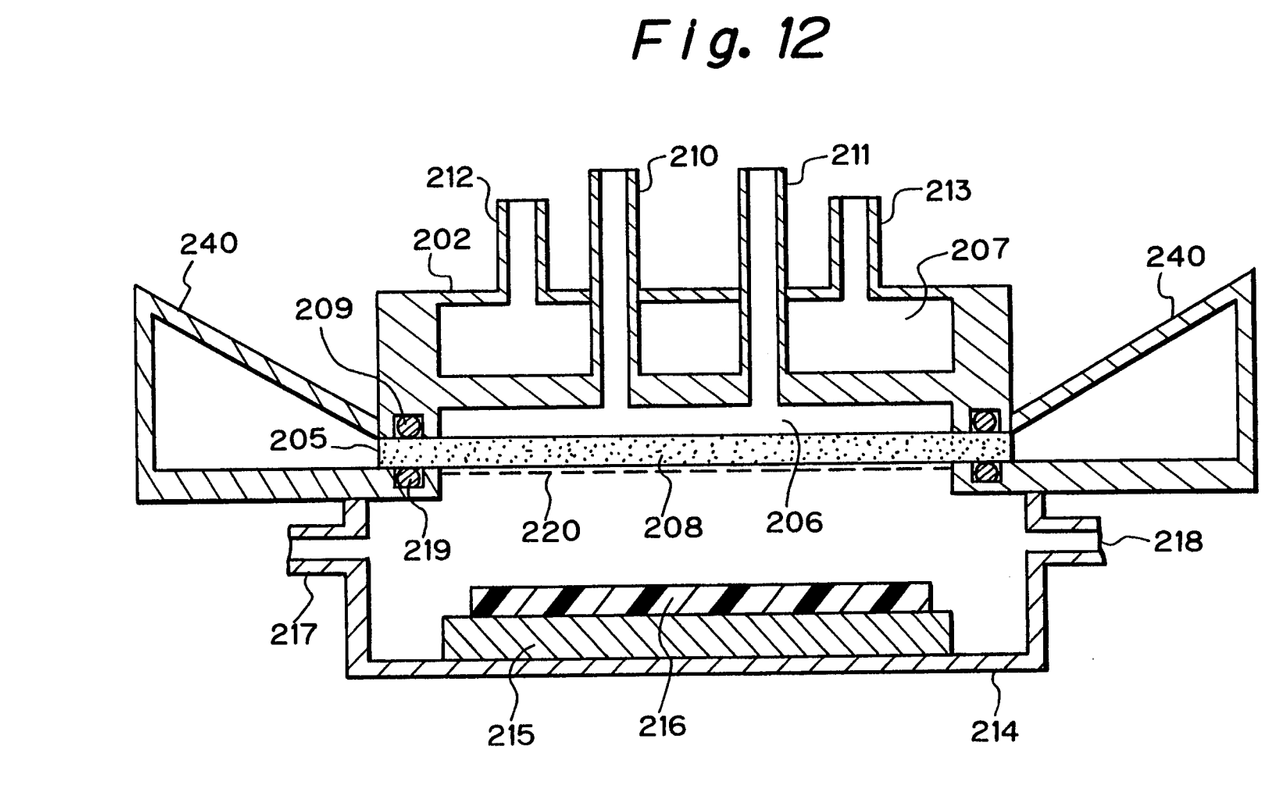

Also, in place of employing a rectangular waveguide for the microwave transmitting circuit, a wedge-shaped waveguide 240 as shown in FIG. 12 may be employed. The wedge shaped waveguide thus formed can intensify the electric field on the dielectric plate 208, which results in a stronger discharge of gas and accordingly the emission of a more intense light in the discharge space 206.

Figure 13:
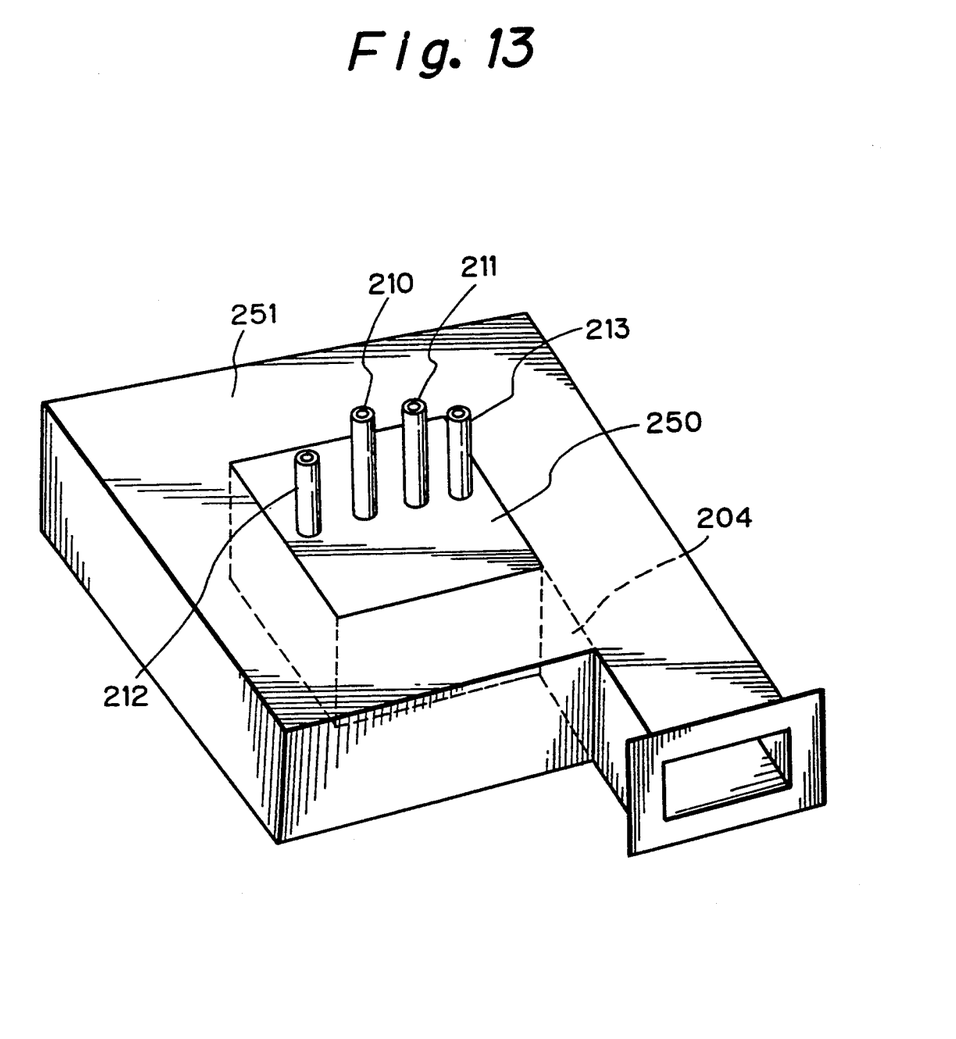

Further, although the discharge chamber 202 is circular in the above described embodiment, a square discharge chamber 250 as shown in FIG. 13 may be employed with a square waveguide 251 disposed to surround the discharge chamber 250.

Although in the above embodiment, the light transmissive dielectric plate 208 is made of sapphire. However, it may be made of another light transmissive material such as synthetic quartz or magnesium fluoride ($MgF_2$).

As described above, a light source apparatus according to the second embodiment has a light transmissive dielectric plate disposed on a surface of a discharge space for generating a plasma. A light transmissive microwave reflecting member is disposed on the side opposite to the discharge space relative to the dielectric plate. The side surface of the dielectric plate is surrounded by a microwave circuit, and a microwave signal having an electric field component in the width of the dielectric plate is introduced from the microwave circuit into the side surface of the dielectric plate. The microwave signal is thus coupled to the dielectric plate, and a microwave electric field is formed within the discharge space to discharge a gas existing in the discharge space to cause emission of light. A generated ultraviolet light is extracted from the microwave reflecting member. It is therefore possible to uniformly generate ultraviolet light over a large area and enhance the luminance of the generated light.

The microwave circuit, when formed of a rectangular waveguide, may employ a part of the wall surface thereof as the terminal of the microwave circuit, that is, a part of the wall surface of the microwave circuit may be used as the terminal thereof, whereby the number of parts constituting the apparatus can be reduced.

While the invention has been described with reference to several embodiments, a variety of changes and modifications can be made without departing from the scope and spirit of the invention. For example, in the above embodiments, the slit corresponding to the side surface of the dielectric plate is formed in a lower portion of the E-plane of the rectangular waveguide. Alternatively, the slit may be formed in another position on the E-plane.

Also, although the rectangular waveguide is disposed so as to surround the entire circumference of the side surface of the dielectric plate, and a part of the wall surface of the rectangular waveguide is used as the terminal of the waveguide in the above embodiments, the invention is not limited to this construction. Alternatively, a separate terminal plate may be provided in place of using the wall surface of the rectangular waveguide. In this case, the rectangular waveguide will not surround the entire circumference of the side surface of the dielectric plate. However, advantages similar to those of the above embodiments can be produced depending on the ratio of the dielectric plate surrounded by the rectangular waveguide.

What is claimed is:

1. A microwave plasma apparatus comprising:
   a discharge chamber for generating a uniform plasma therein;
   a dielectric plate including a planar surface and a side surface about a perimeter of the planar surface wherein the planar surface is a surface of said discharge chamber; and
   a microwave circuit coupled to substantially the whole side surface of said dielectric plate, such that a microwave signal in said microwave circuit having an electric field component in a direction parallel to the side surface of said dielectric plate is coupled to substantially the whole side surface of the dielectric plate,
   wherein a microwave electric field is uniformly formed within said discharge chamber to generate the uniform plasma.

2. A microwave plasma apparatus according to claim 1, wherein said microwave circuit comprises a rectangular waveguide, and a part of a wall surface of said rectangular waveguide is utilized as a terminal portion of said waveguide.

3. A microwave discharge light source apparatus according to claim 1, wherein said microwave circuit comprises a rectangular waveguide, and a part of a wall surface of said rectangular waveguide is utilized as a terminal portion of said waveguide.

4. A microwave plasma apparatus comprising:
   means defining a discharge chamber;
   means coupled to said discharge chamber for establishing a plasma therein;
   a dielectric plate comprising a planar surface and a side surface about a perimeter of the planar surface;
   means supporting said dielectric plate in a position such that the planar surface forms a surface of said discharge chamber;
   a microwave circuit disposed about substantially the whole side surface of said dielectric plate;
   means for establishing a microwave signal with an electric field component in a direction parallel to the side surface of the dielectric plate for propagation of the signal in said microwave circuit; and
   means for coupling said microwave signal to substantially the whole side surface of said dielectric plate so as to form a uniform electric field within said discharge chamber to generate a uniform plasma therein.

5. A microwave plasma apparatus according to claim 4, wherein said means for establishing a microwave signal for propagation and said microwave circuit includes:
a waveguide, and means defining a terminal portion of said waveguide included therein.

6. A microwave plasma apparatus according to claim 5,
wherein said discharge chamber includes means for positioning a substrate therein; and
wherein said means coupled to said discharge chamber for establishing a plasma therein includes means for introducing a gas into and means for removing a gas from said discharge chamber.

7. A microwave plasma apparatus according to claim 6, wherein said means supporting said dielectric plate comprises:
means in said waveguide defining a slit, said slit having a height substantially identical to the thickness of said dielectric plate such that said dielectric plate can be positioned in said slit; and
means positioned between said discharge chamber and said dielectric plate for hermetically sealing said discharge chamber.

8. A microwave plasma apparatus according to claim 7, and further comprising:
a conductive plate disposed in contact with a surface of said dielectric plate, the peripheral side surface of said conductive plate being electrically and mechanically connected to said waveguide such that said waveguide completely electrically and mechanically surrounds said dielectric plate.

9. A microwave plasma apparatus according to claim 8,
wherein said waveguide further comprises a microwave supply port;
a part of a wall surface of said waveguide comprises said terminal portion of said waveguide;
said waveguide has a substantially rectangular cross-section; and
said microwave signal is introduced into said microwave circuit through said microwave supply port.

10. A microwave plasma apparatus according to claim 9,
wherein said dielectric plate is a ring-shaped dielectric plate; and
wherein said microwave supply port is provided so as to introduce said microwave signal from a direction substantially tangential to the direction of propagation of said microwave signal in said microwave circuit.

11. A microwave plasma apparatus according to claim 9,
wherein said dielectric plate is a ring-shaped dielectric plate; and
wherein said microwave supply port is provided so as to introduce said microwave signal from a direction substantially perpendicular to the direction of propagation of said microwave signal in said microwave circuit.

12. A microwave plasma apparatus according to claim 9,
wherein said dielectric plate is a rectangular dielectric plate; and
wherein said microwave supply port is provided so as to introduce said microwave signal from a direction substantially tangential to the direction of propagation of said microwave signal in said microwave circuit.

13. A microwave plasma apparatus according to claim 9,
wherein said dielectric plate is a rectangular dielectric plate; and
wherein said microwave supply port is provided so as to introduce said microwave signal from a direction substantially perpendicular to the direction of propagation of said microwave signal in said microwave circuit.

14. A microwave plasma apparatus according to claim 8,
wherein said waveguide further comprises a microwave supply port;
a part of a wall surface of said waveguide comprises said terminal portion of said waveguide;
said waveguide has a substantially wedge-shaped cross-section; and
said microwave signal is introduced into said microwave circuit through said microwave supply port.

15. A microwave plasma apparatus according to claim 14,
wherein said dielectric plate is a ring-shaped dielectric plate; and
wherein said microwave supply port is provided so as to introduce said microwave signal from a direction substantially tangential to the direction of propagation of said microwave signal in said microwave circuit.

16. A microwave plasma apparatus according to claim 14,
wherein said dielectric plate is a ring-shaped dielectric plate; and
wherein said microwave supply port is provided so as to introduce said microwave signal from a direction substantially perpendicular to the direction of propagation of said microwave signal in said microwave circuit.

17. A microwave plasma apparatus according to claim 14,
wherein said dielectric plate is a rectangular dielectric plate; and
wherein said microwave supply port is provided so as to introduce said microwave signal from a direction substantially tangential to the direction of propagation of said microwave signal in said microwave circuit.

18. A microwave plasma apparatus according to claim 14,
wherein said dielectric plate is a rectangular dielectric plate; and
wherein said microwave supply port is provided so as to introduce said microwave signal from a direction substantially perpendicular to the direction of propagation of said microwave signal in said microwave circuit.

19. A microwave plasma apparatus according to claim 4,
wherein said plasma defines a source of light, said dielectric plate being designed and constructed to allow passage of said light therethrough.

20. A microwave plasma apparatus according to claim 19,
wherein said microwave signal has an electric field component in the width of said dielectric plate; and wherein said microwave signal propagates in said microwave circuit so as to introduce the microwave signal from the peripheral side surface of said dielectric plate to couple said microwave signal to said dielectric plate.

21. A microwave plasma apparatus according to claim 20, wherein said means for establishing a microwave signal for propagation and said microwave circuit includes:
   a waveguide, and means defining a terminal portion of said waveguide included therein.

22. A microwave plasma apparatus according to claim 21, and further comprising:
   a light-transmissive microwave reflecting member disposed on a surface of said dielectric plate.

23. A microwave plasma apparatus according to claim 22, and further comprising:
   means defining a reaction chamber;
   wherein said dielectric plate is supported in a position so as to form a side surface of said reaction chamber.

24. A microwave plasma apparatus according to claim 23, and further comprising:
   means for introducing a gas into and means for removing a gas from said discharge chamber;
   wherein said discharge chamber includes means for positioning a substrate therein; and
   wherein said means coupled to said discharge chamber for establishing a plasma therein include means for introducing a gas into and means for removing a gas from said discharge chamber.

25. A microwave plasma apparatus according to claim 24, wherein said means supporting said dielectric plate comprises:
   means in said waveguide defining a slit, said slit having a height substantially identical to the thickness of said dielectric plate such that said dielectric plate can be positioned in said slit;
   means positioned between said reaction chamber and said dielectric plate for hermetically sealing said reaction chamber; and
   means positioned between said dielectric plate and said discharge chamber for hermetically sealing said discharge chamber.

26. A microwave plasma apparatus according to claim 25, and further comprising:
   means defining a cooling bath provided in contact with at least one wall of said discharge chamber including means for introducing into and means for removing a liquid from said cooling bath;
   wherein said light generated by said plasma passes through said dielectric plate and said light-transmissive microwave reflective member into said reaction chamber so as to affect a substrate supported by said positioning means therein.

27. A microwave plasma apparatus according to claim 26,
   wherein said waveguide further comprises a microwave supply port;
   a part of a wall surface of said waveguide comprises said terminal portion of said waveguide;
   said waveguide has a substantially rectangular cross-section; and
   said microwave signal is introduced into said microwave circuit through said microwave supply port.

28. A microwave plasma apparatus according to claim 27,
   wherein said dielectric plate is a ring-shaped dielectric plate; and
   wherein said microwave supply port is provided so as to introduce said microwave signal from a direction substantially tangential to the direction of propagation of said microwave signal in said microwave circuit.

29. A microwave plasma apparatus according to claim 27,
   wherein said dielectric plate is a ring-shaped dielectric plate; and
   wherein said microwave supply port is provided so as to introduce said microwave signal from a direction substantially perpendicular to the direction of propagation of said microwave signal in said microwave circuit.

30. A microwave plasma apparatus according to claim 27,
   wherein said dielectric plate is a rectangular dielectric plate; and
   wherein said microwave supply port is provided so as to introduce said microwave signal from a direction substantially tangential to the direction of propagation of said microwave signal in said microwave circuit.

31. A microwave plasma apparatus according to claim 27,
   wherein said dielectric plate is a rectangular dielectric plate; and
   wherein said microwave supply port is provided so as to introduce said microwave signal from a direction substantially perpendicular to the direction of propagation of said microwave signal in said microwave circuit.

32. A microwave plasma apparatus according to claim 26,
   wherein said waveguide further comprises a microwave supply port;
   a part of a wall surface of said waveguide comprises said terminal portion of said waveguide;
   said waveguide has a substantially wedge-shaped cross-section; and
   said microwave signal is introduced into said microwave circuit through said microwave supply port.

33. A microwave plasma apparatus according to claim 32,
   wherein said dielectric plate is a ring-shaped dielectric plate; and
   wherein said microwave supply port is provided so as to introduce said microwave signal from a direction substantially tangential to the direction of propagation of said microwave signal in said microwave circuit.

34. A microwave plasma apparatus according to claim 32,
   wherein said dielectric plate is a ring-shaped dielectric plate; and
   wherein said microwave supply port is provided so as to introduce said microwave signal from a direction substantially perpendicular to the direction of propagation of said microwave signal in said microwave circuit.

35. A microwave plasma apparatus according to claim 32,
   wherein said dielectric plate is a rectangular dielectric plate; and
   wherein said microwave supply port is provided so as to introduce said microwave signal from a direction substantially tangential to the direction of propagation of said microwave signal in said microwave circuit.

36. A microwave plasma apparatus according to claim 32,
wherein said dielectric plate is a rectangular dielectric plate; and
wherein said microwave supply port is provided so as to introduce said microwave signal from a direction substantially perpendicular to the direction of propagation of said microwave signal in said microwave circuit.

37. A microwave plasma apparatus comprising:
a discharge chamber for generating a uniform plasma;
a dielectric plate comprising a top planar surface, a bottom planar surface and a side surface disposed between the top and bottom planar surfaces about a perimeter of the planar surfaces, wherein one of the planar surfaces is a surface of said discharge chamber;
a microwave circuit coupled to substantially the whole side surface of said dielectric plate, such that a microwave signal in said microwave circuit having an electric field component in a direction parallel to the side surface of said dielectric plate is coupled to substantially the whole side surface of the dielectric plate.

38. A microwave plasma apparatus as claimed in claim 37, wherein:
the top planar surface of the dielectric plate is a bottom surface of said discharge chamber disposed above the dielectric plate; and
the bottom planar surface of the dielectric plate is a top surface of a reaction chamber disposed below the dielectric plate.

39. A microwave plasma apparatus as claimed in claim 37, wherein:
the bottom planar surface of the dielectric plate is a top surface of the discharge chamber disposed below the dielectric plate.

40. A microwave discharge light source apparatus comprising:
a discharge chamber for generating a uniform plasma therein;
a dielectric plate comprising a top planar surface, a bottom planar surface and a side surface disposed between the top and bottom planar surface about a perimeter of the top and bottom planar surfaces, wherein the top planar surface is a bottom surface of said discharge chamber;
a microwave reflecting member disposed below and substantially parallel to the bottom planar surface of said dielectric plate; and
a microwave circuit coupled to substantially the whole side surface of said dielectric plate, said microwave circuit adapted to introduce a microwave signal having an electric field component in a direction parallel to the side surface of the dielectric plate to substantially the whole side surface of said dielectric plate,
wherein a uniform microwave electric field is formed within said discharge chamber to generate the uniform plasma, and light from said plasma is passed through the dielectric plate and through said microwave reflecting member to a reaction chamber disposed below the microwave reflecting member.

41. The microwave plasma apparatus, as claimed in claims 6, 40 1, or 37, wherein the microwave circuit is a wedge shaped waveguide.

42. The microwave plasma apparatus, as claimed in claim 6, 40 1, or 37, wherein the microwave circuit is a square shaped rectangular waveguide.

43. The microwave plasma apparatus, as claimed in claims 6, 40 1, or 37, wherein the microwave circuit is a circular shaped rectangular waveguide.

* * * * *